(12) United States Patent
Fablet et al.

(10) Patent No.: US 8,698,657 B2
(45) Date of Patent: Apr. 15, 2014

(54) METHODS AND SYSTEMS FOR COMPRESSING AND DECOMPRESSING DATA

(75) Inventors: Youenn Fablet, La Dominelais (FR); Romain Bellessort, Rennes (FR); Hervé Ruellan, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 11 days.

(21) Appl. No.: 13/608,415

(22) Filed: Sep. 10, 2012

(65) Prior Publication Data

US 2014/0070966 A1    Mar. 13, 2014

(51) Int. Cl.
*H03M 7/38*    (2006.01)

(52) U.S. Cl.
USPC ............................................ 341/51; 341/106

(58) Field of Classification Search
USPC ......... 341/51, 50, 106, 55, 59, 60, 81, 82, 87; 708/203, 212; 709/206
See application file for complete search history.

(56) References Cited

U.S. PATENT DOCUMENTS

| 5,373,290 A * | 12/1994 | Lempel et al. ................... 341/51 |
| 7,868,793 B2 | 1/2011 | Bellessort et al. ............ 341/107 |
| 8,234,288 B2 | 7/2012 | Ruellan .......................... 707/756 |
| 8,341,129 B2 | 12/2012 | Denoual et al. ................ 707/693 |
| 8,364,621 B2 | 1/2013 | Fablet et al. ..................... 706/45 |
| 2006/0112264 A1 | 5/2006 | Agarwal ......................... 713/150 |
| 2008/0250055 A1 | 10/2008 | Ruellan et al. ................ 707/102 |
| 2008/0298459 A1 | 12/2008 | Yang et al. ..................... 375/240 |
| 2009/0183067 A1 | 7/2009 | Fablet ............................ 715/234 |
| 2009/0254882 A1 | 10/2009 | Ruellan .......................... 717/120 |
| 2010/0010995 A1 | 1/2010 | Fablet et al. ....................... 707/6 |
| 2010/0050089 A1 | 2/2010 | Kim et al. ...................... 715/749 |
| 2010/0115397 A1 | 5/2010 | Bellessort et al. ............ 715/234 |
| 2010/0153837 A1 | 6/2010 | Bellessort et al. ............ 715/234 |
| 2010/0241949 A1 | 9/2010 | Ruellan et al. ................ 715/234 |
| 2010/0287460 A1 | 11/2010 | Denoual et al. ............... 715/234 |

* cited by examiner

*Primary Examiner* — Joseph Lauture
(74) *Attorney, Agent, or Firm* — Fitzpatrick, Cella, Harper & Scinto

(57) ABSTRACT

The present invention relates to data compression using compression dictionary. A compression method according to the invention comprises obtaining an initial compression dictionary and a separate secondary dictionary SD; determining at least one subpart of the secondary dictionary that correlates with a block of data DB to compress; updating the initial compression dictionary by inserting the determined at least one subpart therein, to obtain an updated compression dictionary used for compressing the block of data; and compressing the block of data using one or more references to entries of the obtained updated compression dictionary.

25 Claims, 8 Drawing Sheets

METHODS AND SYSTEMS FOR COMPRESSING AND DECOMPRESSING DATA

FIELD OF THE INVENTION

The present invention relates in general to data compression and in particular, to data compression and data decompression using a compression dictionary.

A particular application of the invention is an improved compression for documents sent over the Hypertext Transfer Protocol (HTTP) headers, in particular in the context of the SPDY protocol.

BACKGROUND OF THE INVENTION

In data compression relying on compression dictionaries, a block of data composing binary data to compress is compressed using one or more references to entries of the compression dictionary.

A conventional approach to finding such references is to search for the same series of bits or bytes among the entries and subparts of the block of data. Then, in the compressed data, subparts are substituted with corresponding references to entries.

This is the case for compression techniques such as the DEFLATE algorithm, the Lempel-Ziv-Welch (LZW) algorithm and the Lempel-Ziv-Markov chain-Algorithm (LZMA) which are based on a sliding window, and also such as the bzip2 algorithm.

The sliding window generally defines the number N of last bytes that have been processed (for compression) and that constitute the compression dictionary from which back-references are searched for.

To enable reciprocal decompression, the compression dictionary is shared between the compressing device or unit and the decompressing device or unit, generally because it is made of the last N bytes of uncompressed data decoded.

However, other situations may occur, such as for example transmitting such a compression dictionary to the decompressing device.

The DEFLATE algorithm is for example implemented in HTTP compression, for instance in the SPDY protocol or the SDCH approach.

The shared dictionary compression on HTTP (SDCH) method is a technique developed by Google™ and implemented within Google Chrome™ to improve web data compression. This technique uses a reference dictionary shared between the server and the web browser client.

In practice, the server generates a static reference dictionary that can be used efficiently for a set of digital resources. This compression dictionary is typically a text file that concatenates strings frequently occurring within the set of resources.

The server exchanges this reference dictionary with the client on the first use of this static dictionary.

The server and client exchange documents that are compressed using the VCDiff method based on the shared reference dictionary, as shown in FIG. 1.

A block of data to compress is compared with reference data in the shared reference dictionary. As many strings in the block of data to compress as possible are replaced by references to corresponding reference entries in the reference dictionary.

VCDiff organizes the stream as follows: strings that do not match any reference data in the reference dictionary are put first as ADD instructions. References to entries in the reference dictionary are then encoded as COPY instructions. Once the stream has been produced, it is compressed with generic lossless compression techniques such as DEFLATE.

Since it may be expensive to do exhaustive searching in large reference dictionaries, only long strings are actually searched for, typically using "fingertips" or "fingerprints" approaches.

For the purposes of illustration, reference is now made to the SPDY protocol, while the invention can apply to a wide variety of dictionary-based compression methods as suggested above.

In messages to be exchanged between communicating devices, there are often lists or groups of items of information that are compressed at one of the communicating devices and decompressed at the other communicating device. This is for example the case for HTTP where HTTP payload is compressed, as well as for SPDY protocol where HTTP headers are compressed.

HTTP is commonly used to request and send web pages, and is based on a client/server architecture, wherein the client sends requests, namely HTTP requests, to the server, and the server replies to the client's requests with responses, namely HTTP responses.

Requests and responses are messages that comprise various parts, among which are non-compressed HTTP headers and compressed HTTP payload. An HTTP header consists of a name along with a corresponding value.

In the first versions of HTTP, a TCP/IP connection was established for each HTTP request/response exchange.

SPDY has been developed to improve this situation by improving HTTP in several ways.

Firstly, it enables several HTTP requests and responses to be sent over a unique TCP/IP connection, thus defining a long-standing connection and a connection context made of the specificities and the history of the long-standing connection. In this way, all the components of a web page (HTML documents, images, JavaScript, etc.) may share the same TCP/IP connection, thus speeding up the web page loading.

Secondly, SPDY implements compression of the HTTP headers exchanged over the shared TCP/IP connection, using the DEFLATE algorithm. This binary compression reduces the network load.

As introduced above, the DEFLATE algorithm performs compression of a serialized binary representation of the HTTP headers, by searching for duplicate strings in the binary representation using a sliding window and replacing them with back references thereto. A serialized binary representation of the HTTP headers results from the serialization of the HTTP headers as a stream of bits (or bytes).

Thanks to the connection context, the DEFLATE algorithm can initiate the compression dictionary with the last 32 kiloBytes (kB) of message headers already processed when processing and compressing a new block of serialized binary HTTP headers in the same long-standing connection.

The compressing device (the server) and the decompressing device (the client) must keep synchronized, sharing the same buffer or compression dictionary containing the previously exchanged headers.

In this way, the algorithm reuses the knowledge of already exchanged headers to improve the headers' compression thanks to the high redundancy of headers between HTTP messages.

Final steps of the DEFLATE algorithm replace symbols of the back references with Huffman codes.

Compression gains obtained by SPDY are acceptable.

In the SPDY context, the same principle as applied to HTTP headers can be applied to web content exchanged as part of SPDY connections, i.e. on HTTP payload. In other words, each web digital resource, i.e. each web document, can be individually compressed using the DEFLATE algorithm.

Experiments were conducted by the inventors to measure the impact of the DEFLATE sliding window size on a set of web pages to exchange. This is illustrated through the plots of FIG. 2.

This Figure shows three plots of the size of compressed web pages for a set of 80 web pages. The three plots correspond to three sizes of the sliding window, respectively 8 kB=$2^{13}$ (plot w13), 16 kB=$2^{14}$ (plot w14) and 32 kB=$2^{15}$ (plot w15), where the plot w15 is the baseline with value 100 for comparison.

As obviously expected, the compression ratio decreases when passing from a 32 kB sliding window to a 16 kB sliding window, and then further decreases from a 16 kB sliding window to a 8 kB sliding window.

However, the loss in compression is not very high, less than 5% in most cases.

SUMMARY OF THE INVENTION

The inventors infer from these results that, while the DEFLATE window size may be up to 32 kB, only the most recent 8 kB are critical in most cases to keep most of the benefit of redundancies within the same web document when compressing web content.

Due to the possibility given by SPDY to compress web documents using redundancies between several documents (because of the SPDY connection context), the inventors have also analyzed the inter-document redundancy as shown in FIG. 3.

The plotted analysis shows the compression results computed for 14 web sites exchanging web content when web documents exchanged by a given web site are compressed one after the other in the transmission order and the connection context is kept from one document to the next one. The first web sites on the left of the Figure are mobile web sites supplying mobile web pages.

For comparison without inter-document redundancy, the baseline 100 is computed by summing the size of all exchanged web documents after being individually compressed (i.e. without using the inter-document redundancy).

As a consequence, the lower the plot in the Figures, the better compressed the corresponding web content when compared to the baseline.

FIG. 3*a* shows the compression results when processing several types of web data provided by the web site, for instance mixing HTML, CSS, JS, images, etc.

FIG. 3*b* shows the compression results when processing only HTML pages, i.e. only one kind of web data.

One may note that since the communication network between web client and the web site may interleave IP packets from two separate documents, the results as shown are only approximation. However, since the IP packet size is small compared to the DEFLATE window size, the approximated results should be close to true results.

These Figures show that keeping the connection context from one document to the other may substantially improve compression performance.

This is particularly significant for mobile web pages and for mobile web sites (left of the plots).

For standard web sites (on the right half of the web sites), the gain in compression is much reduced but remains as good as individual ZIP.

There may be two reasons for this particularity of compression efficiency between mobile web sites and standard web sites.

First, the connection context is generally less relevant from one document to the other in standard web sites. This is because standard web documents (such as HTML web pages) that are very redundant from one to another may be separated by a large amount of web data (such as images), thus leading in a DEFLATE window size that is too small to detect inter-document redundancies.

Second, standard web data is generally bigger than mobile web data. While this reduces the possibility for inter-document redundancies (the DEFLATE window size may not be able to contain the beginning of two consecutive HTML documents), intra-document redundancies may also be equal or more important than inter-document redundancy. These intra-document redundancies are equally captured by keeping or not the compression context.

As inter-document redundancy may provide a significant improvement in compression, in particular for mobile web, the inventors have submitted a new scheme for data compression that combines, in the case of SPDY, both intra-document and inter-document redundancies. In particular, as shown below, the inventors have considered recycling the less relevant part of the DEFLATE sliding window (i.e. the remaining 24 kB once the critical 8 kB are kept) to improve compression based on inter-document redundancies if properly initialized.

More generally, when a compression method relies on a compression dictionary, for example based on a sliding window on past data already processed, it may be worthwhile to provide additional redundancy information so as to improve compression performance.

The present invention intends to provide an appropriate compression scheme to use such additional redundancy information with low complexity increase.

In this context, according to a first aspect of the invention, there is provided a method of compressing data, comprising compressing a block of data using one or more references to entries of a compression dictionary, the method further comprising:

obtaining an initial compression dictionary and a separate secondary dictionary;

determining at least one subpart of the secondary dictionary that correlates with the block of data to compress;

updating the initial compression dictionary by inserting the determined at least one subpart therein, to obtain the compression dictionary used for compressing the block of data.

The compression method according to the invention thus achieves better compression performance on HTML documents than conventional techniques, such as DEFLATE or VCDiff. In addition, processing complexity remains low and reasonable, in particular avoiding complex character-by-character searching as in VCDiff since the determination of subparts may be performed in a substantially simpler manner.

This is achieved by modifying the compression dictionary used for the actual compression of the block of data, wherein such modification is conducted based on a correlation with the block of data to compress. New redundancy items of data highly correlated with the data to encode can therefore be added to the compression dictionary at low cost. This ensures the modification is well suited for compressing that specific block of data.

As disclosed below, such additional redundancy data may add inter-document redundancy as explained above for the SPDY protocol. But other kinds of additional redundancy data may be used, such as static information relating to the current communication session between two communicating devices, or a reference dictionary as in SDCH. Also as described below, additional redundancy data may be found between various blocks of EXI (standing for Efficient XML Interchange) data when compressing a new EXI blocks of the same structured document.

In addition, a single step of compression is kept that can implement the conventional DEFLATE, but based on the modified compression dictionary. This contributes to maintaining a low complexity process. It further makes it possible for the method according to the invention to keep the flexibility of the DEFLATE algorithm where parameters (e.g. size of the dictionaries) can change on the fly when the compressing and decompressing devices so decide together.

Correlatively, according to a second aspect of the invention, there is provided a compressing unit for compressing data, comprising a compression dictionary and a data compressor for compressing a block of data using one or more references to entries of the compression dictionary, the compressing unit further comprising:

an initial compression dictionary and a separate secondary dictionary;

a correlating data retrieving module for determining at least one subpart of the secondary dictionary that correlates with the block of data to compress;

a compression dictionary updating module for updating the initial compression dictionary by inserting the determined at least one subpart therein, to obtain the compression dictionary used for compressing the block of data.

According to a third aspect of the invention regarding corresponding decompression, there is provided a method of decompressing a bitstream, comprising decompressing a block of data of the bitstream using one or more references to entries of a decompression dictionary, the method further comprising:

obtaining an initial decompression dictionary and a separate secondary dictionary;

obtaining, from the bitstream, updating information;

determining at least one subpart of the secondary dictionary based on the obtained updating information;

updating the initial decompression dictionary by inserting the determined at least one subpart therein, to obtain the decompression dictionary used for decompressing the block of data.

This decompressing method is for a decompressing device or unit to be able to retrieve original data when the latter is compressed according to the compressing method of the invention.

According to a fourth aspect of the invention, there is provided a decompressing unit for decompressing a bitstream, comprising a decompression dictionary and a data decompressor for decompressing a block of data of the bitstream using one or more references to entries of the decompression dictionary, the decompressing unit further comprising:

an initial decompression dictionary and a separate secondary dictionary;

an updating information module for obtaining, from the bitstream, updating information;

a correlating data retrieving module for determining at least one subpart of the secondary dictionary based on the obtained updating information;

a decompression dictionary updating module for updating the initial decompression dictionary by inserting the determined at least one subpart therein, to obtain the decompression dictionary used for decompressing the block of data.

According to a fifth aspect of the invention, there is provided a non-transitory computer-readable medium storing a program which, when executed by a microprocessor or computer system in an apparatus, causes the apparatus to perform the steps of:

obtaining an initial compression dictionary and a separate secondary dictionary;

determining at least one subpart of the secondary dictionary that correlates with the block of data to compress;

updating the initial compression dictionary by inserting the determined at least one subpart therein, to obtain a compression dictionary; and compressing a block of data using one or more references to entries of the compression dictionary.

Other features of embodiments of the invention are further defined in the dependent appended claims. While these features are mostly described with reference to methods of the invention, similar features are provided for a corresponding device.

For example, the initial compression dictionary may comprise blocks of data that have already been compressed, for example the N last processed data blocks as defined by a conventional sliding window.

Also, the compressing method may be implemented in a compressing device having a communication session with a remote communicating device, and the secondary dictionary may thus comprise data already exchanged between the compressing device and the remote communicating device.

These two exemplary features thus define a particular application of the invention, possibly implemented in the web context, updating an intra-document redundancy compression dictionary with additional inter-document redundancy or updating an intra-EXI-block redundancy compression dictionary with additional inter-EXI-block redundancy from possibly the same structured document.

For example, a DEFLATE compression dictionary with limited size (e.g. 32 kB) is updated with data relating to already exchanged web documents. This updating may be done by replacing the less significant 24 kB (compared to the critical last 8 kB as defined above) with such data. In this way, inter-document redundancy or the like is added in the DEFLATE compression dictionary before compression.

Appropriate selection of relevant data already exchanged should be done in correlation with the data to be compressed, so that its compression is significantly improved. This selection may use fingerprints as disclosed below.

Also, prior selection of relevant data for the secondary dictionary may have an impact on the compression improvement. In the above example, preference will thus be given to data already exchanged that is of the same content type (i.e. HTML page, image, CSS, Javascript, etc.) as the block of data to compress, and/or that has already been transmitted between the same compressing and remote communicating devices or units.

In one embodiment of the invention, determining at least one subpart that correlates with the block of data to compress comprises computing fingerprints of several subparts of the block of data to compress as hash values of said subparts and comparing the computed fingerprints with a bank of fingerprints corresponding to subparts of the secondary dictionary. In this embodiment, the fingerprints are used as correlation information between the data block to compress and the secondary dictionary in order to find the most correlated subparts, i.e. potentially the subparts (e.g. strings) with the best redundancy information.

Using the fingerprints or hash values does not provide an extensive search of subparts and does not ensure an exact string match will be found. However, this is not prejudicial to the invention. This is because the determined subparts used for updating the compression dictionary are seen as a potential source of redundancy information. Inserting a subpart that does not match will probably decrease the redundancy in the compression dictionary with the data block to compress but it will not create any damage to the integrity of the resulting compressed data.

According to a particular feature, determining at least one subpart that correlates with the block of data to compress comprises obtaining a list of subparts of the secondary dictionary, the corresponding fingerprints of which matching with fingerprints for the block of data to compress, and selecting at least one subpart from the list as subpart or subparts to insert into the initial compression dictionary.

In a variant, determining at least one subpart that correlates with the block of data to compress comprises obtaining a list of subparts of the secondary dictionary, the corresponding fingerprints of which matching with fingerprints for the block of data to compress; comprises selecting at least one subpart from the list; and comprises expanding a selected subpart with data surrounding it within the secondary dictionary to obtain an expanded subpart to insert into the initial compression dictionary.

This configuration with expansion of the selected subpart or subparts makes it possible to define more precisely which part of the secondary dictionary would best fit with the data to compress regarding the correlation criterion. This is generally at the cost of additional processing driving the expansion mechanism.

For example, expanding a selected subpart comprises computing surrounding fingerprints for one or more parts of surrounding data of the selected subpart as hash values of said one or more parts, and selecting parts of surrounding data to expand the selected subpart depending on the surrounding fingerprints and fingerprints for the corresponding parts in the block of data to compress. Still using a correlation approach based on fingerprints, this configuration increases the selected subpart with other parts that are highly likely to provide other redundancy data for the block of data to compress. A better compression of the latter is thus achieved, in particular where the data put into the secondary dictionary are highly redundant in relation to the data to compress.

In a variant of that example, expanding a selected subpart comprises merging two subparts of the list that are successive in the secondary dictionary. This generates a single merged subpart of presumably redundant data, thus reducing processing cost compared to two subparts to handle. Of course, such a merging operation can be iteratively performed on a set of three or more contiguous subparts.

According to a particular feature, determining at least one subpart that correlates with the block of data to compress comprises computing, for the or each determined subpart of the list, a location in the initial compression dictionary where to insert the determined subpart; and selecting at least one subpart from the list depends on the computed inserting location of each subpart of the list. This is to ensure the most relevant data is kept in the initial compression dictionary. Indeed, since such an initial compression dictionary is generally built from the N last data blocks processed, the above provision ensures selection of the subparts that will keep the most recently processed data blocks where most of redundancy can be found.

In a variant, selecting at least one subpart from the list comprises selecting a part of the secondary dictionary that includes the maximum number of subparts from the list. This makes it possible to handle only one part to insert in the initial compression dictionary, with a high probability of redundancy. Of course, the selected part is preferably restricted by a predefined maximum size.

In another variant that indirectly restricts the possibilities of selection, the bank of fingerprints used for the comparison when compressing a block of data is restricted to fingerprints corresponding to one or more subparts that occur after the last subpart in the secondary dictionary that is used for updating an initial compression dictionary when compressing a previous block of data. This reduces the size of the secondary dictionary to be considered for search, thus reducing processing costs. This provision is based on the assumption that data usually changes in the same way, meaning that the data to compress changes as the data in the secondary dictionary changes. A higher probability of redundancy (for compression efficiency) is thus found in less time in the data of the secondary dictionary that follows the last subpart used.

According to a feature of the invention, the subparts of the block of data to compress used for computing fingerprints are defined based on specific items within the block of data. For documents written in markup language (e.g. XML, HTML), specific items may be specific structural markers such as opening and/or ending tags. For JSON documents, y and may also be used. Markers in EXIF Binary content are also suitable for such use.

This provision is because such specific items may efficiently delimit or define consistent subparts that are easily reused or repeated. Resulting subparts are thus handled as single elements to provide a basis each time for redundancy compression with a high degree of probability.

In some embodiments, the initial compression dictionary changes from the compression of one block of data to the compression of a next block of data, by adding the one block of data to the initial compression dictionary before compressing the next block of data; and the method further comprises determining the position of the oldest data in the initial compression dictionary as the location where the determined at least one subpart is inserted for the updating. Generally, this position of the oldest data corresponds to the position where the one data block will be inserted in the initial compression dictionary before processing the next block of data.

This provision makes it possible to keep the most recent data in the compression dictionary, in which the highest degree of redundancy with the data to compress can be found. Optimal compression is thus obtained.

In one embodiment of the invention, the method further comprises sending the compressed block of data together with updating information representing the updating of the initial compression dictionary used for compressing the block of data. This makes it possible for the receiving device (embedding decompressing capacities) to be able to conduct the decompression of the received compressed block of data. In particular, such decompression may be according to the above-defined method of decompressing a bistream.

According to a particular feature, the updating information comprises the number of determined subparts inserted in the initial compression dictionary and, for each inserted subpart, the length of the subpart, the position of the subpart in the secondary dictionary and a location for insertion in the initial compression dictionary. In a particular embodiment suitable for DEFLATE where only one subpart with a predefined length (known by both the compressing and decompressing devices) is allowed for insertion at a predefined location in the initial compression dictionary (in replacement of the oldest 24 kB), the updating information only comprises the position of the subpart in the secondary dictionary. This reduces the size of the final bitstream to be transmitted, and thus reduces network load.

In a particular embodiment of the invention, determining at least one subpart that correlates with the block of data to compress comprises determining a subpart that correlates with a block of data just compressed and selecting, for the next block of data to compress, the subpart following said determined subpart in the secondary dictionary, as a subpart to insert in the initial compression dictionary. This is particularly suitable for the case of data streaming where the block of data to compress may not be received at the time of determining the updating of the compression dictionary. The above provision thus assumes that the same behavior of generating data can be encountered in the data to compress and in the secondary dictionary. Therefore, a correlation for the previous block of data that is received and known makes it possible to find a corresponding portion of the secondary dictionary, the following part of which is assumed to be potentially highly redundant with regard to the next block of data to compress.

Additionally, in the specific context of XML data being encoded using the Efficient XML Interchange format using the pre-compression or compression modes, the data is organized into channels. A first channel, referred to as structure channel, contains the structure information of the XML data, while other channels, referred to as value channels, contain the values of the XML data grouped according to the same element or attribute name.

In this context, according to a sixth aspect of the invention, there is provided a method of encoding a block of structured data of a structured document, comprising obtaining a structure channel grouping structural information of the structured data and at least one value channel grouping content information that corresponds to the same structural information; and compressing at least one of the structure and value channels using the above method for compression data, A separate secondary dictionary made of another XML document already encoded using the EXI pre-compression mode may be used to update initial compression dictionaries to be used for compressing the structure and value channels.

In a variant, the separate secondary dictionary used when compressing the block of structured data of the structured document (e.g. an EXI block as defined in the EXI recommendation) may be made of one or more other blocks of structured data of the same structured document that have already been compressed. Preferably, it is the last encoded EXI block. This is to take advantage of the high redundancy within parts of the same document.

Given the alternative, an initial compression dictionary to compress the structure channel may be updated based on the structure channel of another block of structured data (be from the same structured document or from another structured document) previously arranged into structure and value channels.

In a variant or in combination, an initial compression dictionary to compress the value channel may be updated based on a corresponding value channel of another block of structured data (be from the same structured document or from another structured document) previously arranged into structure and value channels, said corresponding value channel of the other block of structured data corresponding to the same structural information as the value channel to compress.

Correlatively, according to a seventh aspect of the invention, there is provided an encoding unit for encoding a block of structured data of a structured document, comprising a channel obtaining unit for obtaining a structure channel grouping structural information of the structured data and at least one value channel grouping content information that corresponds to the same structural information; and a compressing unit as defined above for compressing at least one of the structure and value channels.

At least parts of the method according to the invention may be computer implemented. Accordingly, the present invention may take the form of an entirely hardware embodiment, an entirely software embodiment (including firmware, resident software, micro-code, etc.) or an embodiment combining software and hardware aspects which may all generally be referred to herein as a "circuit", "module" or "system". Furthermore, the present invention may take the form of a computer program product embodied in any tangible medium of expression having computer usable program code embodied in the medium.

Since the present invention can be implemented in software, the present invention can be embodied as computer readable code for provision to a programmable apparatus on any suitable carrier medium, for example a tangible carrier medium or a transient carrier medium. A tangible carrier medium may comprise a storage medium such as a floppy disk, a CD-ROM, a hard disk drive, a magnetic tape device or a solid state memory device or the like. A transient carrier medium may include a signal such as an electrical signal, an electronic signal, an optical signal, an acoustic signal, a magnetic signal or an electromagnetic signal, e.g. a microwave or RF signal.

BRIEF DESCRIPTION OF THE DRAWINGS

Embodiments of the invention will now be described, by way of example only, and with reference to the following drawings in which.

DETAILED DESCRIPTION OF EMBODIMENTS OF THE INVENTION

Figure 1:
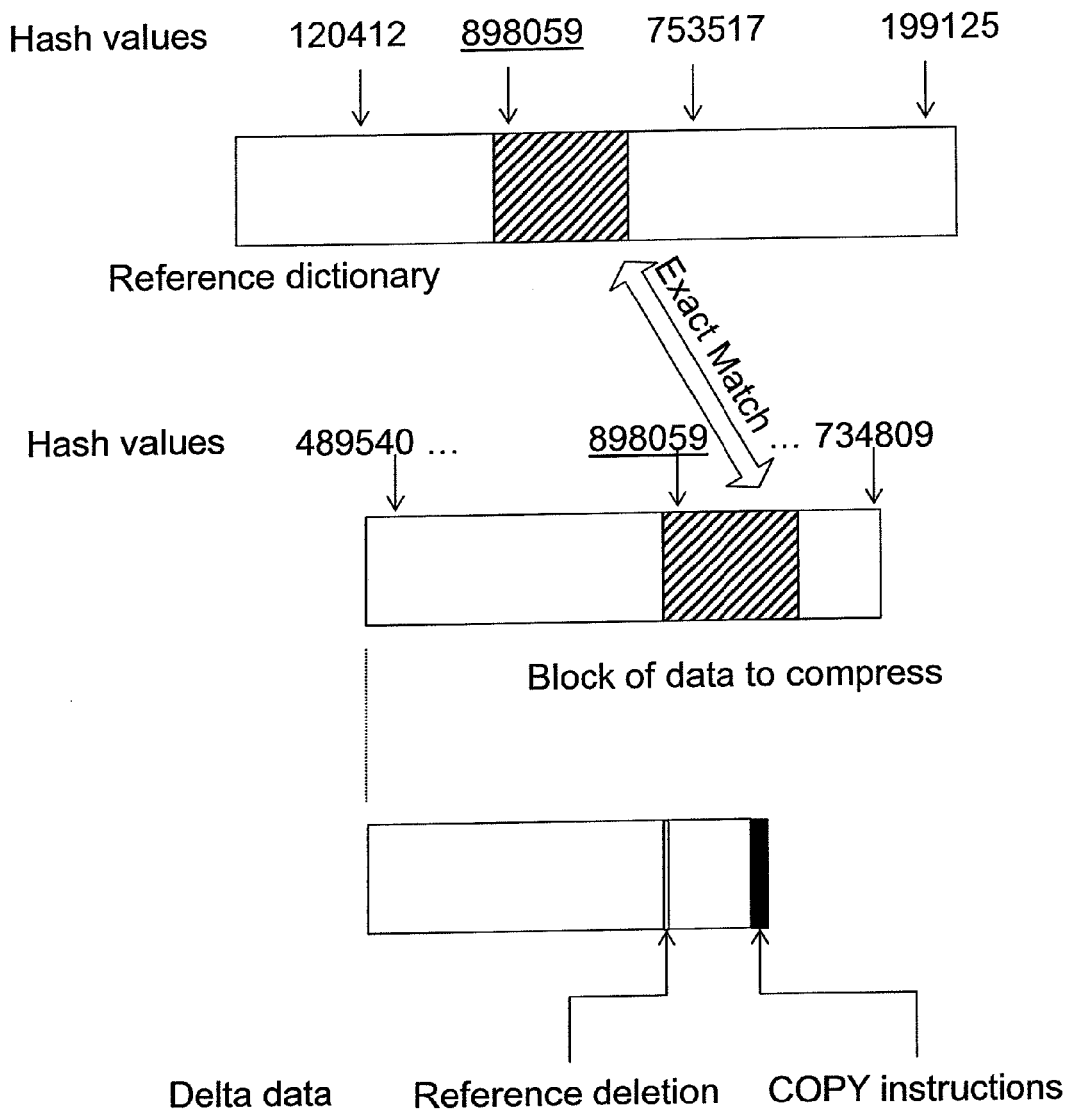
FIG. 1 illustrates the VCDiff method of the prior art to compress data.

The invention provides methods and devices for compressing and decompressing data, for example during a web content exchange between a client and a server in a client-server communication system. An exemplary application is the Internet where the well-known HTTP protocol is client-server based to provide digital resources such as web pages.

As briefly introduced above and as further described below, a compression method according to the invention comprises, at a compressing device or unit:

obtaining an initial compression dictionary and a separate secondary dictionary;

determining at least one subpart of the secondary dictionary that correlates with the block of data to compress;

updating the initial compression dictionary by inserting the determined at least one subpart therein, to obtain an updated compression dictionary; and compressing the block of data using one or more references to entries of the updated compression dictionary.

The dictionaries may be seen as collections of data, for example implemented through buffer memories. In general such dictionaries are of limited size, in particular if implemented in low resource devices.

Compression dictionaries are well known, for example from DEFLATE, to provide support for back references to data already processed, thus providing a high level of compression.

As taught by the present invention, a secondary dictionary is used to provide new data for updating such compression dictionaries. This is particularly relevant if such new data have a high probability of being redundant with regard to a new block of data to compress. Indeed, in such situation, the compression with back references to such new data will improve the compression ratio compared to a case where such references are missing.

Of course, an appropriate choice of data forming the secondary dictionary as well as an appropriate selection of subparts therefrom provide better compression performance each time. Below examples of secondary dictionaries and of selection criteria are given.

Generally, those dictionaries are known by both the compressing and decompressing device so as to make it possible to perform similar operations. It is therefore said that the dictionaries are shared.

At the decompressing device or unit, the decompression of a received bitstream correspondingly comprises:

obtaining an initial decompression dictionary and a separate secondary dictionary;

obtaining, from the bitstream, updating information, i.e. the information determined by the compressing device to perform its own updating of the initial compression dictionary;

determining at least one subpart of the secondary dictionary based on the obtained updating information;

updating the initial decompression dictionary by inserting the determined at least one subpart therein, to obtain an updated decompression dictionary; and decompressing a block of data of the bitstream using one or more references to entries of the updated decompression dictionary.

For appropriate decompression, the initial decompression dictionary is similar to the initial compression dictionary used by the compression device. The same applies for the secondary dictionaries used by the compression and decompression devices.

An exemplary application of the invention relates to the DEFLATE algorithm in SPDY. This is to take advantage of the connection context which may provide inter-document redundancy to improve the compression ratio of web content (such as HTML, CSS, JavaScript, images, etc.).

Figure 3A:
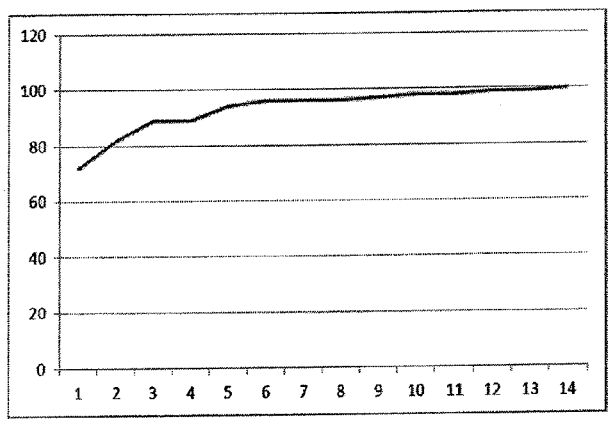
FIGS. 3a and 3b are plots showing the impact of using redundancy between web documents on their compression, respectively when mixing several types of documents and when using only one type of document.
Figure 3B:
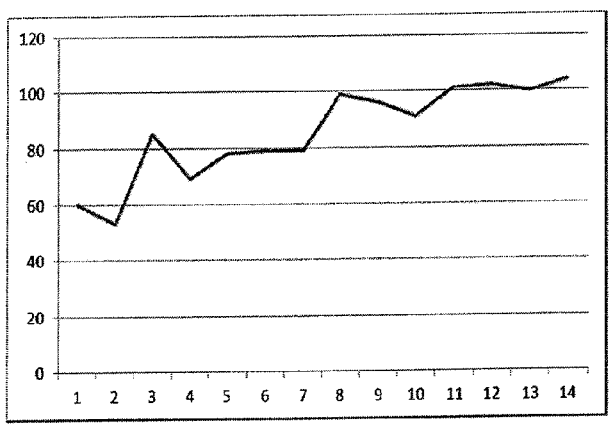

Preferably a specific DEFLATE context is defined for each type of media or web content. This is to increase the inter-document redundancy as shown in FIG. 3b. Of course, the invention also applies where no distinction between media types is provided, resulting in the situation of FIG. 3a.

Other applications of the invention may refer to other compression techniques based on sliding windows, such as LZW and LZMA, but also to other techniques such as bzip2. With compression performance similar to known techniques, the invention generally decreases dictionary sizes and sliding window size compared to those known techniques.

Back to the DEFLATE example, a conventional DEFLATE compression dictionary is made of a 32 kB sliding window on the last data processed but stores this 32 kB data in non-compressed form.

In the case of large web pages, the 32 kB of the compression dictionary may be entirely used to store a single web page.

Since some parts of two separate web pages can be very similar, the inventors have considered as important to keep potentially redundant parts of a first web page in the DEFLATE sliding window used to compress a second web page. This is the aim of the updating according to the invention in the present example.

Figure 2:
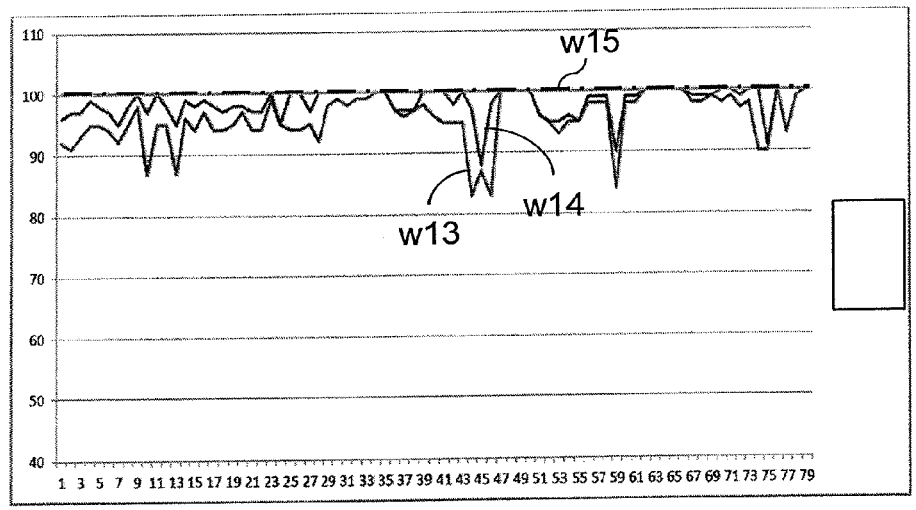
FIG. 2 is a plot showing the impact of the DEFLATE sliding window size on the compression of web documents.

As inferred from above FIG. 2, only part of the sliding window (the critical 8 kB) may be kept to handle intra-document redundancies, i.e. to store data of the currently compressed web page. The remaining part of the 32 kB may therefore be used to provide inter-document redundancy.

Considering a single content type for the SPDY example (for example web pages), the secondary dictionary is made of a buffer storing the data of that content type that has been already transmitted.

Compression is performed by a server device, while a client device performs decompression of compressed data received from the server.

Preferably, only the data transmitted from the same compressing device (server) to the same decompressing device (client) is kept. This is because the redundancy between such data is higher than if data exchanged with other devices are taken into account.

The secondary dictionary is of limited size, meaning that it changes with time replacing oldest data with most recent data.

New data to compress and to send to the client is obtained and split into blocks of 32 kB.

For each 32 kB block of data, the conventional DEFLATE compression dictionary is optimized using data from the secondary dictionary, so as to provide basis for inter-document redundancy.

In particular, this optimization of the compression dictionary involves computing fingerprints or hash values of relevant portions in the secondary dictionary and in the block of data to compress, so as to find which subpart or subparts of the secondary dictionary should be inserted in the 24 kB of the DEFLATE dictionary.

Once the DEFLATE dictionary has been updated using such subparts, a conventional DEFLATE compression is applied to the block of data, based on the updated and optimized DEFLATE dictionary.

Next, the server can send the compressed data to the client, together with updating information representing the updating of the DEFLATE dictionary used for compressing the block of data.

The client can then reconstruct the same optimized DEFLATE dictionary to efficiently perform the same decompression of the received compressed data.

Figure 4:
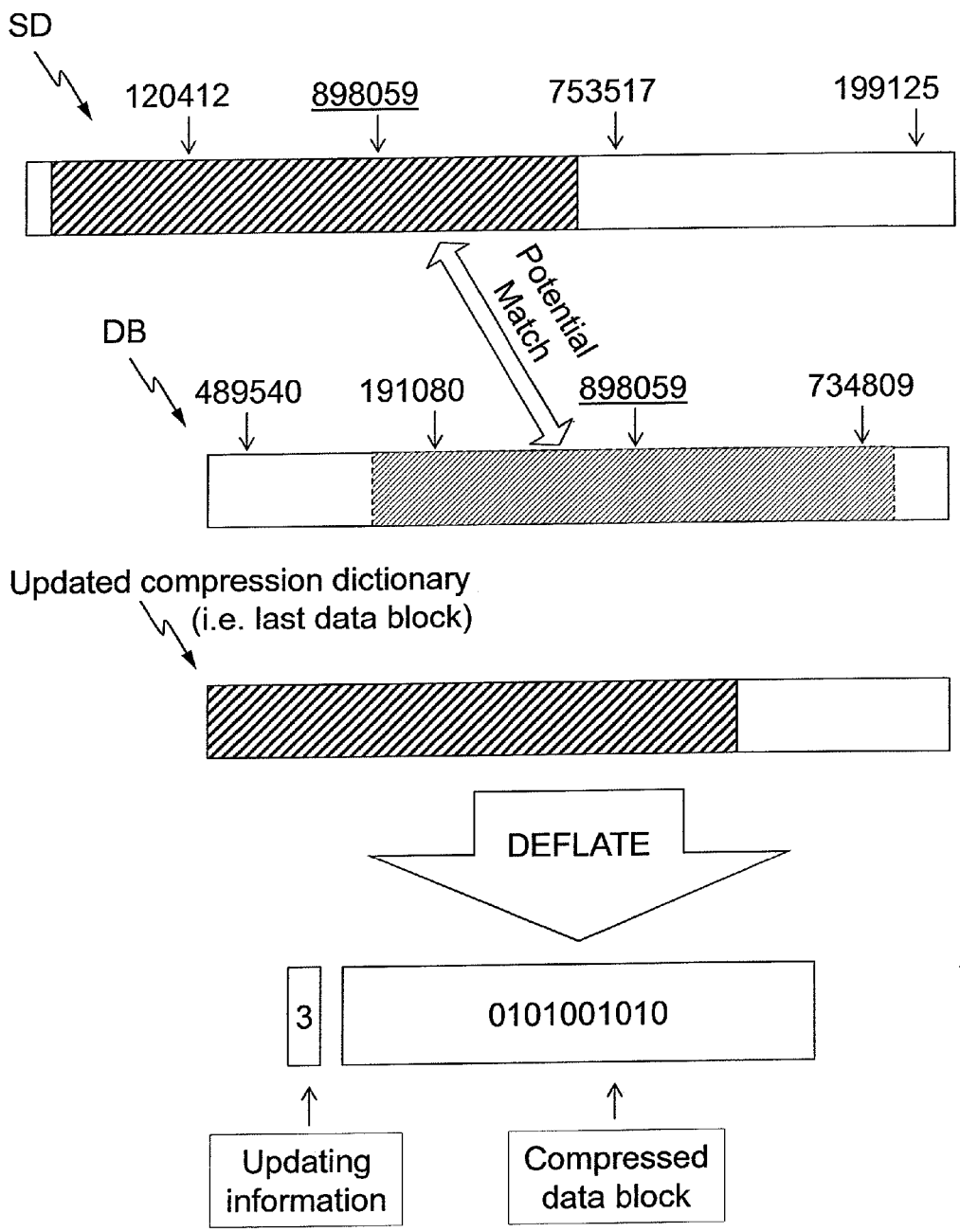
FIG. 4 schematically illustrates the compression method of the invention.

FIG. 4 schematically shows the compression approach according to the invention.

A 32 kB data block DB is to be compressed based on the knowledge of the previous data block (conventional DEFLATE compression dictionary) and data from a secondary dictionary SD.

As explained above, the invention provides updating of the conventional DEFLATE compression dictionary by mixing data from the previous data block and from the secondary dictionary SD.

To compute which data from the secondary dictionary SD is added to the conventional DEFLATE dictionary and at which positions, correlation values are computed between the data in the secondary dictionary and the 32 kB block of data to compress.

Fingerprints or hash values are examples of such correlation values that can be used.

In the Figure, four fingerprints have been computed from four 24 kB subparts of the secondary dictionary, namely 120412, 898059, 753517 and 199125.

Also, four fingerprints have been computed from four 24 kB subparts of the block of data, namely 489540, 191080, 898059 and 734809.

Fingerprints are thus compared and one fingerprint is found in both secondary dictionary and the block of data to compress: 898059.

There is a high probability of redundancy between the 24 kB subpart of SD corresponding to that fingerprint value and the subpart of DB corresponding to the same fingerprint value.

As a consequence, this subpart of SD is selected and inserted at the start of the DEFLATE compression dictionary, therefore overwriting the 24 kB of oldest data of the past previous data block.

Once the DEFLATE compression dictionary has been updated, conventional DEFLATE compression is performed.

Due to the implementation of the conventional DEFLATE compression, a DEFLATE hardware implementation can be reused as part of the present invention. A small overhead over DEFLATE is actually needed for storage and fingerprint computation to enable dictionary updating, while the core of the processing (DEFLATE algorithm) can be achieved by conventional hardware implementation.

Although the above example shows a server holding data and compressing such data before sending them to a client, the method of the invention can also be used in a streaming mode at a compressor and a corresponding decompressor. Indeed, the method of the invention allows compressing and sending of the data as soon as available and conversely allows processing of the compressed data for decompression as soon as received. This is because the method does not require storage of the data to compress.

In the streaming scheme, updating information should be determined based on a block of data already compressed, for example by selecting, for a next block of data to compress, the subpart of the secondary dictionary that follows a first subpart highly correlated with the block of data already compressed.

However, using some storage of the data to compress may improve the results in terms of compression. This is because having the data available makes it possible to build or predict the updating information based on part of the data to compress itself, and not on already compressed data.

The updated compression dictionary is used as a basis for back references to redundancy data in order to provide compression. Non optimal updating is therefore not damaging the integrity of the data. This flexibility of the method makes it possible to avoid static parameters. It is therefore suitable for dynamic cases while prior art VCDiff is more directed to static dictionaries. Such a dynamic approach thus enables dictionary sizes to be dynamically adapted (and shared) taking into account for example specificities of the compressing device, the decompressing device and the communication link between them.

Figure 5:
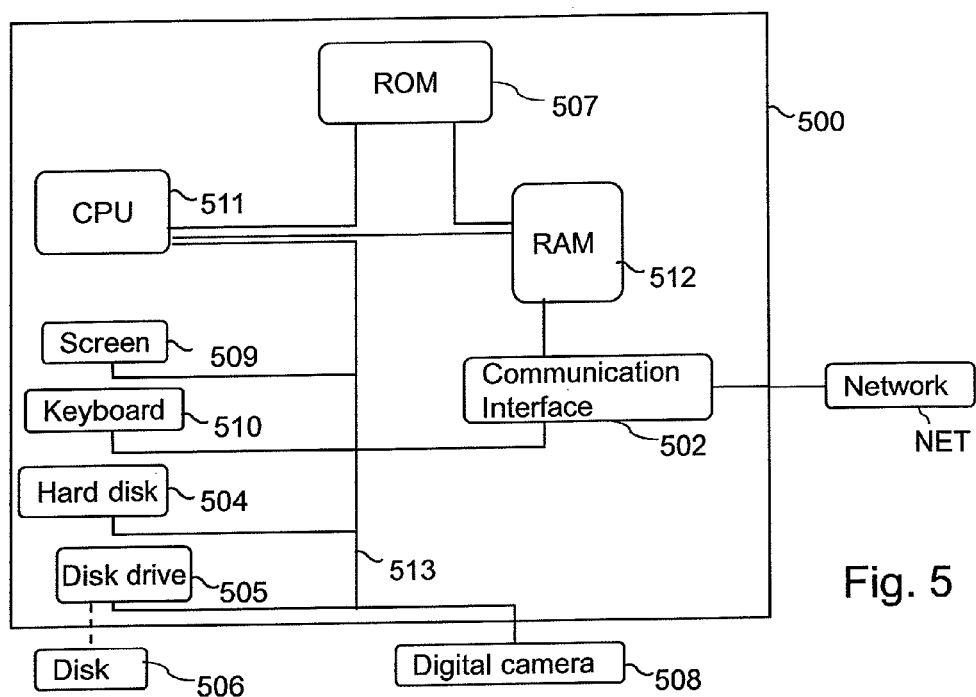
FIG. 5 is a block diagram illustrating components of a communicating device in which embodiments of the invention may be implemented.

FIG. 5 schematically illustrates a communicating device 500, either a client acting as a decompressing device or a server acting as a compressing device, or a device embedding both functionalities, configured to implement at least one embodiment of the present invention. The communicating device 500 may be a device such as a micro-computer, a workstation or a light portable device. The communicating device 500 comprises a communication bus 513 to which there are preferably connected:

- a central processing unit 511, such as a microprocessor, denoted CPU;
- a read only memory 507, denoted ROM, for storing computer programs for implementing the invention;
- a random access memory 512, denoted RAM, for storing the executable code of methods according to embodiments of the invention as well as the registers adapted to record variables and parameters necessary for implementing methods according to embodiments of the invention, in particular the dictionaries, the bank of fingerprints as defined below and the data in course of being processed; and
- a communication interface 502 connected to the communication network NET over which a client-server based communication can be implemented. The communication interface is provided to send and receive compressed data together with updating information as defined above.

Optionally, the communicating device 500 may also include the following components:

- a data storage means 504 such as a hard disk, for storing computer programs for implementing methods of one or more embodiments of the invention;
- a disk drive 505 for a disk 506, the disk drive being adapted to read data from the disk 506 or to write data onto said disk;
- a screen 509 for displaying data such as a web page in the case of the client device and/or serving as a graphical interface with a user, by means of a keyboard 510 or any other pointing means.

The communicating device 500 can be connected to various peripherals, such as for example a digital camera 508, each being connected to an input/output card (not shown) so as to supply data to the communicating device 500.

The communication bus provides communication and interoperability between the various elements included in the communicating device 500 or connected to it. The representation of the bus is not limiting and in particular the central processing unit is operable to communicate instructions to any element of the communicating device 500 directly or by means of another element of the communicating device 500.

The disk 506 can be replaced by any information medium such as for example a compact disk (CD-ROM), rewritable or not, a ZIP disk or a memory card and, in general terms, by an information storage means that can be read by a microcomputer or by a microprocessor, integrated or not into the communication device, possibly removable and adapted to store one or more programs whose execution enables a method according to the invention to be implemented.

The executable code may be stored either in read only memory 507, on the hard disk 504 or on a removable digital medium such as for example a disk 506 as described previously. According to a variant, the executable code of the programs can be received by means of the communication network NET, via the interface 502, in order to be stored in one of the storage means of the communicating device 500, such as the hard disk 504, before being executed.

The central processing unit 511 is adapted to control and direct the execution of the instructions or portions of software code of the program or programs according to the invention, which instructions are stored in one of the aforementioned storage means. On powering up, the program or programs that are stored in a non-volatile memory, for example on the hard disk 504 or in the read only memory 507, are transferred into the random access memory 512, which then contains the executable code of the program or programs, as well as registers for storing the variables and parameters necessary for implementing the invention.

The execution of the program or programs instantiates software modules implementing specific functions, for example a correlating data retrieving module for determining at least one subpart of the secondary dictionary that correlates with the block of data to compress; a compression dictionary updating module for updating the initial compression dictionary by inserting the determined at least one subpart therein, to obtain the compression dictionary used for compressing the block of data; a data compressor for compressing a block of data using one or more references to entries of the compression dictionary; a fingerprint module in the correlating data retrieving module for computing fingerprints of several subparts of the block of data to compress as hash values of said subparts and a comparator for comparing the computed fingerprints with a bank of fingerprints corresponding to subparts of the secondary dictionary; an expanding module in the correlating data retrieving module for expanding a determined subpart with data surrounding it within the secondary dictionary to obtain an expanded subpart to insert into the initial compression dictionary; an insertion location module for determining a location in the initial compression dictionary where to insert the determined subpart.

At the decompressor, such instantiated software modules may comprise an updating information module for obtaining, from a received bitstream, updating information; a correlating data retrieving module for determining at least one subpart of the secondary dictionary based on the obtained updating information; a decompression dictionary updating module for updating the initial decompression dictionary by inserting the determined at least one subpart therein, to obtain the decompression dictionary used for decompressing the block of data; a data decompressor for decompressing a block of data of the bitstream using one or more references to entries of the decompression dictionary.

In this embodiment, the device is a programmable apparatus which uses software to implement the invention. However, alternatively, the present invention or some functional modules of it may be implemented in hardware (for example, in the form of an Application Specific Integrated Circuit or ASIC).

Figure 6:
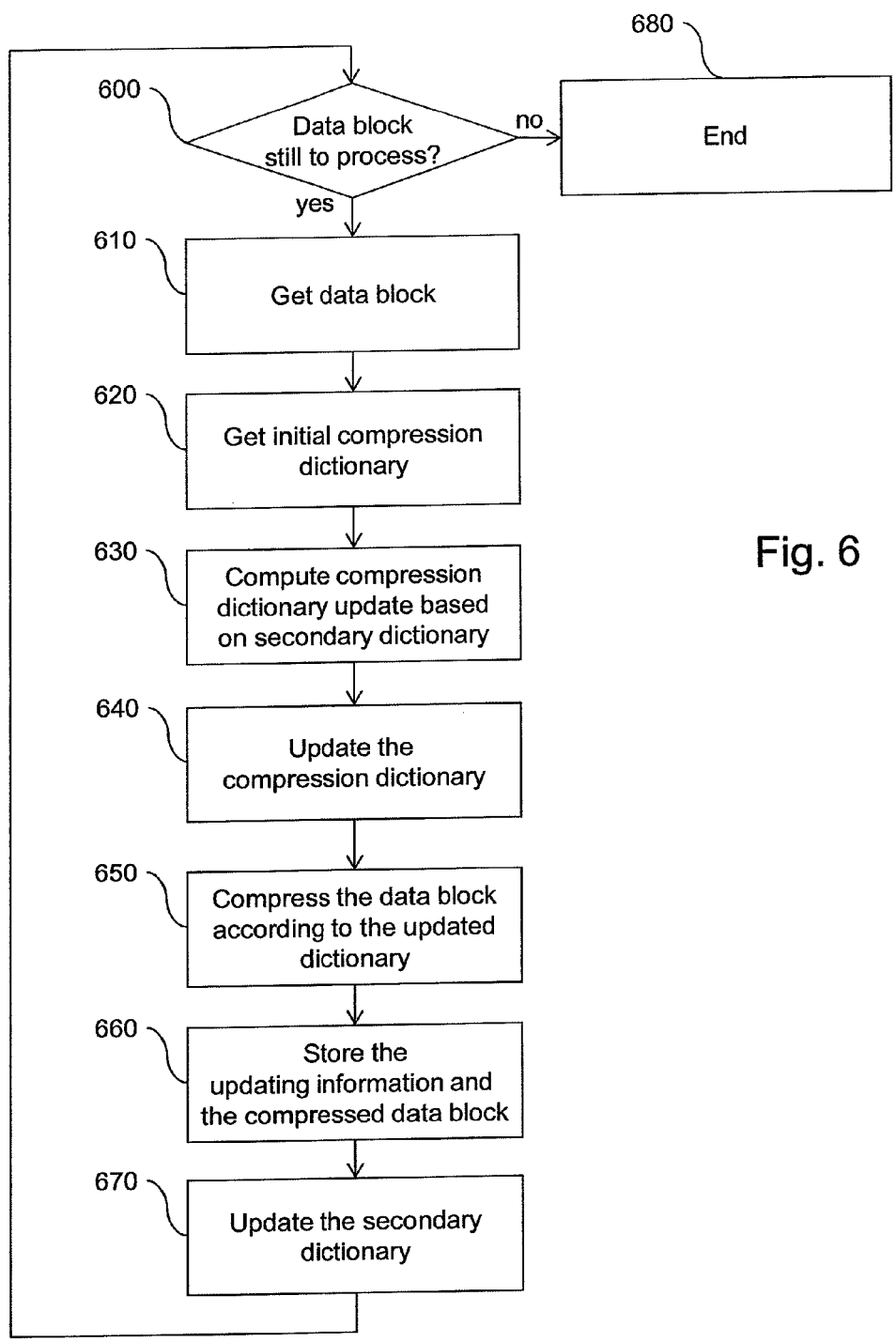
FIG. 6 is a flowchart illustrating general steps of a compression method of the invention.

FIG. 6 illustrates general steps for the compressing device (e.g. the server) to compress, i.e. encode, data to be sent.

One illustrative embodiment regards the Efficient XML Interchange (EXI) format using the pre-compression or compression modes. Blocks of structured data composing a structured document are received that comprise items of structural information and items of content information. XML data is an example of such structured data.

Both EXI modes comprise a first encoding step that consists in rearranging the structured data of each EXI block into channels: a structure channel and at least one value channel. The structure channel groups structural information of the structured data keeping their original order in the structured data. Each value channel groups together content information that corresponds to the same structural information (i.e. to several instances of that same structural information). In EXI, the content values are grouped according to the same associated grime (qualified name), i.e. when they are associated with the same element or attribute name.

The EXI compression mode further comprises a compression step of such rearranged data. In other words, the compression method of FIG. 6 may then be applied to any or each obtained channel, be structural channel or value channel.

The secondary dictionary to be used during the compression step according to the invention (to update an initial compression dictionary) may be based on one or more previously encoded EXI blocks of the same XML document or on one or more previously encoded documents using the EXI pre-compression mode, i.e. other structured data previously arranged into structure and value channels. Preferably, the last encoded EXI block of the same structured document is used.

In one embodiment, an initial compression dictionary to compress the structure channel is updated based on the structure channel of the previously encoded EXI block or document, for instance by inserting all or part of that structure channel of that previously encoded EXI block or document.

In another embodiment, an initial compression dictionary to compress a value channel is updated based on the value channel of the previously encoded EXI block or document that corresponds to the same structural information as the value channel to compress, if any. This may be done for instance by inserting all or part of that corresponding value channel of the previously encoded EXI block or document, and preferably the beginning of that corresponding value channel. Given this approach, the updating of the initial compression dictionary for value channels is only possible when a corresponding value channel exists in the EXI block or document previously encoded using the EXI pre-compression mode.

As input data, the algorithm receives a series of bytes (or bits) split into consecutive data blocks, for instance one of the above structure and value channels.

The data block size can vary, especially if a single buffer update is possible on a data block. The data block size can be computed from the compression dictionary size (typically the sliding window size) used by the compression technique. Typically when DEFLATE is in use with a sliding window of 32 kB, the data block size can be set to values such as 8, 16 or 32 kB.

The process of the Figure operates on each data block (as shown by the loop) to provide an updated compression dictionary with a view to improving the redundancy between the compression dictionary in use and the data block to compress.

The main process starts at step 600 by considering a next data block which is obtained at step 610.

An initial compression dictionary is obtained at step 620 for that data block to compress.

The initial compression dictionary may be a default compression dictionary, for example made of the last data processed. In the case of DEFLATE, this may be the 32 kB sliding window made of the last data block.

As a variant, it may be the compression dictionary generated during the compression iteration of the last data block (step 640 below) in which the last data block has been added on the basis of the sliding window approach.

For the first data block to compress, the initial compression dictionary may be empty or may be filled with data from a past document or from shared knowledge between the compressing device and the decompressing device.

The next step 630 consists in obtaining a secondary dictionary separate from the initial compression dictionary and in determining subparts therein that correlate with the data block to compress. This is to identify parts of reference data in the secondary dictionary that can be highly redundant with the data to compress.

This key step is described below in more details with reference to FIG. 7.

As suggested above, the secondary dictionary may be made of the data already exchanged between the compressing and decompressing devices (i.e. client and server). In particular, one type of data may be taken into account, having the same type as that of the data to compress.

Alternatively, it may be a static dictionary shared by both devices, like the shared dictionary of SDCH.

Once one or more subparts of the secondary dictionary have been identified as relevant for redundancy support, they are used at step 640 to update the initial compression dictionary by inserting at least one of the subparts therein, to obtain an updated compression dictionary used for compressing the block of data.

This updated compression dictionary should be more redundant with regard to the data block to compress, therefore improving the compression ratio.

Based on the updated compression dictionary, the current data block is then compressed at step 650 using a standard compression method, for example the DEFLATE algorithm. A compressed data block is thus obtained.

At step 660, the compressed data block is stored in a buffer together with updating information representing the updating of the initial compression dictionary used for compressing the block of data. This storage may be temporary before transmitting the data to the decompressing device (e.g. the client), for example for streaming processing or for having enough data to build a data packet to be sent over the network NET.

Examples of updating information are given below. Generally, it is relatively small compared to the compressed data block. In this context, its encoding or compression is not required to be highly efficient.

A simple encoding technique that can handle arbitrary large integer values should be sufficient to handle arbitrary large reference data chunks.

In case a lot of small updates are actually detected, it is possible to regroup the updates into larger updates that will cover almost all detected small updates. That allows reducing the number of updating information to encode, thus reducing the encoded size of that information.

Subsequent to step 660, the secondary dictionary may optionally be updated at step 670 if appropriate.

This is for example the case if that secondary dictionary changes from one data block to another data block. The update may also be based on the compression dictionary update.

It may also be the case if it changes over time, for example when new data (e.g. a new web page) is exchanged between the client and the server.

The process iterates through the different data blocks composing the data to compress until no new data block remains (test 600), in which case the process ends at step 680.

As can be seen from this Figure, the processing-intensive task for compression (i.e. step 650) is well separated from the other steps which are less processing-intensive.

A different strategy for implementation can therefore be contemplated, where the compression task 650 may be implemented in hardware and the other tasks in software. Furthermore, processing of the data blocks may be parallelized at the compressor side so as to improve the compression speed. In particular, this parallelization is possible if the updated compression dictionary for a data block can be obtained without waiting for the compression of other data blocks. For example, this is the case of FIG. 8 below, but not the case of data streaming.

Step 630 is now described with reference to FIG. 7.

The algorithm of that Figure intends to determine which subpart or subparts of the secondary dictionary may be used to update the initial compression dictionary.

This determination takes into account a correlation measure between subparts of the data block to compress and subparts of the secondary dictionary as illustrated by FIG. 4.

Obtaining a correlation measure comprises computing fingerprints of several subparts of the block of data to compress as hash values of said subparts. Such fingerprints may then be compared to a bank of fingerprints corresponding to subparts of the secondary dictionary to determine the most relevant subparts to be used for the update of the compression dictionary.

Fingerprints consist in hash values of the subparts of the data. When two strings have the same hash value, there is a high probability that the two strings are the same. If hashed strings often overlap, the use of a rolling hash may be used to decrease the hash computation cost.

Fingerprints are generally computed for rather large strings, such as 16 or 32 or more character-long strings, that preferably start on specific anchor points in the data.

In case of web contents, well known markers can be used as anchor points. For HTML, start tags and end tags are good anchor points, while for JavaScript or JSON, round brackets are also good candidates. Using such specific markers makes it possible to reduce the number of fingerprints for given data to a small number.

In embodiments of the invention, the fingerprints are computed for both the data from the secondary dictionary (e.g. past web documents) and the data to compress.

When a match occurs between fingerprints of the secondary dictionary and fingerprints of the data to compress, there is a high probability that there is a string match. In addition, this is performed at very moderate processing costs since the fingerprint computation is not demanding. In such a case, the initial compression dictionary is updated with the corresponding data from the secondary dictionary to provide new basis for redundancy and thus for efficient compression of the current data block.

Since the fingerprints are only used to detect subparts with potential redundancy with the data block to compress and then to add such subparts in the compression dictionary used for compressing said data block, there is no need to search for small subparts. This is because such a search for small strings will be made at the compression level. As a consequence, the search process for subparts with potential redundancy can target only very long strings, such as 64 or 128 character-long strings that do not overlap and that may not be contiguous.

Figure 7:
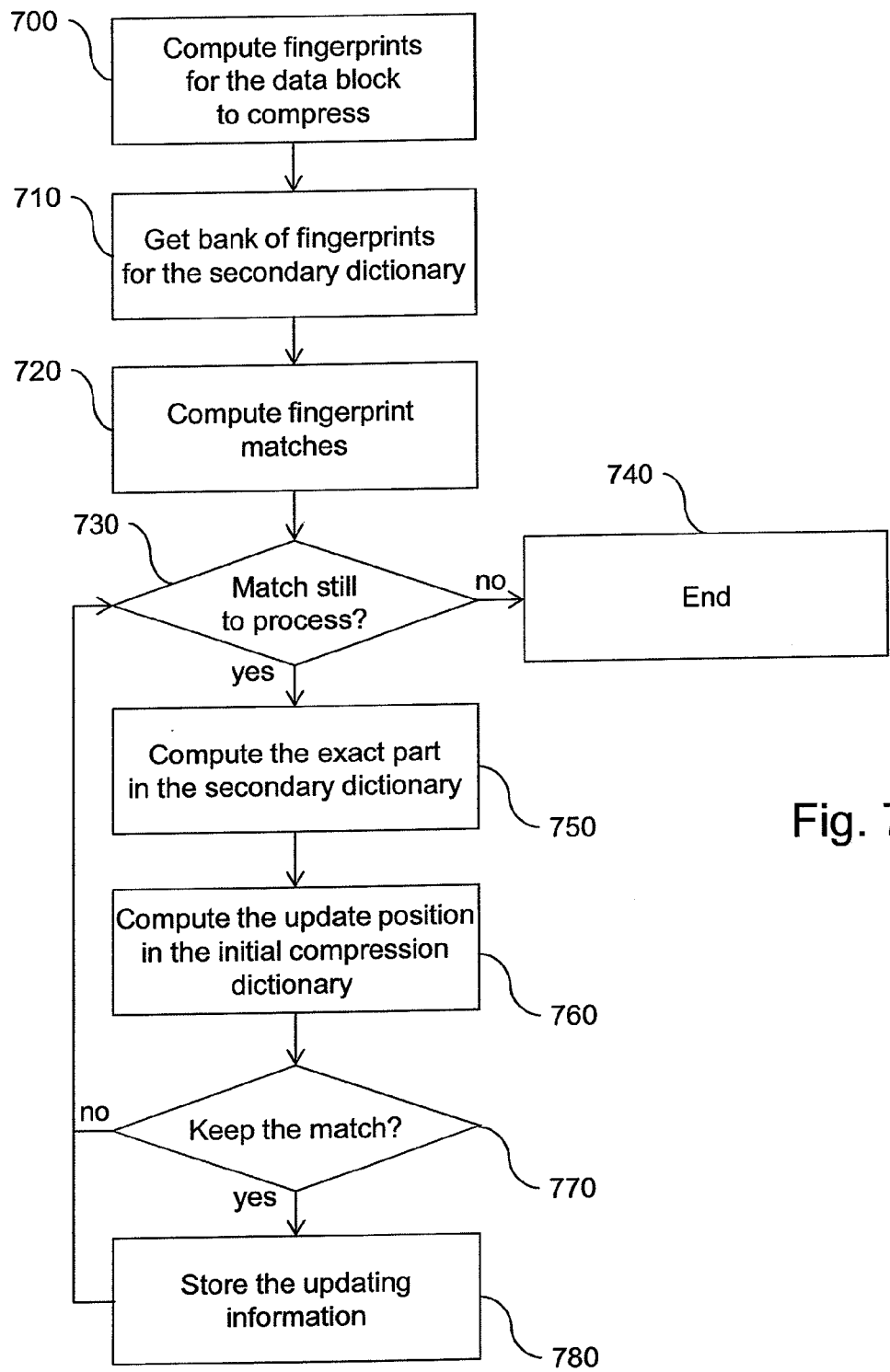
FIG. 7 is a flowchart illustrating steps for determining compression dictionary updating information in the course of the method of FIG. 6.

The algorithm of FIG. 7 starts at step 700 by computing fingerprints of several subparts of the data block to compress, for example in a similar way to the Rabin-Karp algorithm.

A bank of fingerprints corresponding to subparts of the secondary dictionary is obtained at step 710.

This may be done through direct computation of the fingerprints from the secondary dictionary.

Alternatively, this may be done by retrieval of fingerprints from past computation when the secondary dictionary substantially remains identical from one data block to the other or when the secondary dictionary comprises data block that were previously compressed. For example, if the secondary dictionary is built from past compressed data, the fingerprints computed during step 700 for that past data may be stored to serve as fingerprints when this data becomes part of the secondary dictionary.

Also, a combination of both approaches can be implemented if the secondary dictionary partly changes from one data block to the other or partly takes into account past compressed data.

To reduce the number of fingerprints to consider, only fingerprints on subparts that occur after the last subpart in the secondary dictionary that has been used for updating an initial compression dictionary when compressing a previous block of data are computed. This is because it is assumed that the secondary dictionary changes in the same way as the data blocks to compress. Thus a higher probability of redundancy for a new data block to compress will be found in the part of the secondary dictionary that follows the part used for the last compressed data block.

Each fingerprint obtained at step 700 for the data block to compress is compared with fingerprints of the bank as obtained at step 710 for the current secondary dictionary. Where two fingerprints are equal, a match between corresponding subparts is detected.

A list of matches is then obtained at step 720. The obtained list comprises the subparts of the secondary dictionary, the corresponding fingerprints of which match with fingerprints for the block of data to compress.

To optimize the comparison of step 720, the fingerprints of the secondary dictionary may be organized to ensure a quick search and in particular a quick not-detected test.

The process then iterates through the matches at step 730 until all matches have been processed, in which case the process ends at step 740).

For each considered match of the list, steps 750 to 780 are performed.

For a given match, the exact subpart of the secondary dictionary that is to be used to update the initial compression dictionary is computed at step 750.

Several approaches may be implemented.

First, it may be decided to select exactly at least one subpart from the list as subpart or subparts to insert into the initial compression dictionary. This means that the update of the initial compression dictionary is performed based on the exact data that has been used to compute the fingerprint.

In a variant, it may be decided to select at least one subpart from the list; and then to expand a selected subpart with data surrounding it within the secondary dictionary to obtain an expanded subpart to insert into the initial compression dictionary. That means that an expanded subpart (compared to the subpart used to compute the fingerprint of the bank) is used for the updating of the compression dictionary.

Determining surrounding data may be based on computing surrounding fingerprints for one or more (small) parts of surrounding data of the selected subpart (to expand) as hash values of said one or more parts. In this case, parts of the surrounding data may be selected to expand the selected subpart depending on the surrounding fingerprints and fingerprints for the corresponding parts in the block of data to compress.

Another embodiment takes advantage of two detected contiguous matches in the list. Such contiguous matches in the list may correspond to contiguous subparts in the secondary dictionary or to two successive subparts in the secondary dictionary, the part between them not being used to generate another fingerprint. In that case, expanding a selected subpart comprises merging two subparts of the list that are successive in the secondary dictionary. As a consequence, the list is updated to merge the two corresponding matches into a single match.

Another approach for expanding a subpart may be based on certain heuristics such as increasing the subpart size by a predetermined number of characters.

Whether or not expansion of the subpart is implemented may be dependent on the nature of the fingerprints. This is because the more restricted (in terms of size of corresponding subpart) the fingerprints, the faster the search therein.

In this context, if there is a large number of fingerprints, updates may be done only based on the subparts that exactly correspond to the fingerprints. If the number of fingerprints is low, the matched subparts only serve as a simple way to synchronize the secondary dictionary with the data block to compress and the data for the update can therefore be expanded to contain a much larger part of the secondary dictionary than the matched subpart.

Once the exact subpart to be used for update for the considered match has been obtained at step 750, the update position in the initial compression dictionary is computed at step 760. In the context of sliding-window-based compression techniques such as DEFLATE, the update position is the location or exact position in the initial compression dictionary where to insert the considered subpart.

This step may be optional if the update position is static or predefined. In the above DEFLATE example, the update position identifies the oldest 24 kB of the sliding window.

In general, since the initial compression dictionary changes over the compression of the data (old data is removed to leave room for the data compressed later on), the update position in the compression dictionary needs to be computed so that the inserted subpart from the secondary dictionary remains in the updated compression dictionary buffer at the time the matched subpart from the data block to compress is being compressed. The position of the update may then be chosen as the position in the initial compression dictionary where the matched data to compress are intended to be inserted for the next iteration.

Following step 760, a decision can be made whether or not to keep the considered match as part of updating information to update the initial compression dictionary, at step 770.

The decision of step 770 may be taken according to different rules.

In a case where only one subpart (i.e. only one match) is selected for the update of the initial compression dictionary, a simple rule may be to select the first subpart of the list. Another simple rule is to select the subpart that is the longest, so to provide the potential higher degree of redundancy in the compression dictionary. Another rule is to select a part of the secondary dictionary that includes the maximum number of subparts from the list.

In a case where several subparts can be used for the update, the selection of which subparts to keep may depend on the computed inserting location in the initial compression dictionary of each subpart of the list. For instance, the subparts that can be inserted at the place of the oldest data in the compression dictionary will be favored. This rule helps ensure that the intra-document redundancies (the redundancies from one data block to the other) are well handled since they usually occur on the most recent data and less frequently on the oldest data.

Another rule is to select two or more parts of the secondary dictionary that include the maximum number of subparts from the list.

If the considered match (i.e. the subpart) is kept, it is stored in a temporary memory as updating information, at step 780. The next match is considered by looping back to step 730.

The updating information comprises, for each kept subpart (i.e. to insert in the initial compression dictionary), the length of the subpart, the position of the subpart in the secondary dictionary and the location of insertion in the initial compression dictionary.

When transmitting the updating information together with the compressed data blocks, the updating information should preferably be compressed or encoded. However, the number of subparts selected for the update may significantly impact the amount of data.

As long as the number of such subparts remains small compared to the overall data size, literal encoding of the updating information appears sufficient.

However, if additional compactness is required, specific algorithms may be shared between the communicating devices (encoder/compressor and decoder/decompressor) to infer update processing based on few items of exchanged updating information. For example, the encoder can encode an index N that corresponds to the matched fingerprint among all the fingerprints, in addition to the update position in the initial compression dictionary. At its end, the decoder then scans the secondary dictionary to identify the location of the $N^{th}$ fingerprint. Once this fingerprint has been located, the corresponding subpart is retrieved (shared expansion mechanism may also be performed) and the updating of the initial compression dictionary can be performed based on the update position that is decoded as a literal value from the updating information.

Where a subpart or subparts with a predefined length (known by both the compressing and decompressing devices) is allowed for insertion at a predefined location in the initial compression dictionary (for example the case for DEFLATE where the oldest 24 kB are replaced), the updating information for each kept subpart only comprises the position of the subpart in the secondary dictionary.

The approach as described until now computes fingerprints on the data block to compress. In other words, it may be implemented when that data block is available in memory.

Some communication mechanisms, such as full streaming, do not make the data block entirely available when starting its compression. Therefore the updating information can only be computed from part of the data block or even based only on previous data already compressed.

The compression method of the invention may apply to such situation, with slight adjustments to obtain the part of the secondary dictionary to use for the update of the initial compression dictionary. Such adjustments assume that the potential redundancies searched for in the secondary dictionary for unknown data to compress are located after the part of the secondary dictionary used for the last data block compressed.

A search for the part of the secondary dictionary used for the latest compressed data is made. This makes it possible to identify a reference position Rd in the secondary dictionary corresponding to the last fingerprint match or to a consistent set of fingerprint matches. The reference position Rd thus defines the part of the secondary dictionary that is redundant with regard to the last data compressed.

The part of the secondary dictionary to select for the compression dictionary update may then be the part located after Rd.

This approach is heuristic and does not ensure the redundancy of the updated compression dictionary increases. One should therefore ensure that the probability that the redundancy decreases is very low, for instance by taking into account the parts of the compression dictionary that were referenced during past compression.

In the case of DEFLATE as shown in FIG. 2, the compression efficiency of some web documents does not suffer if the size of the sliding window is reduced to 16 kB. In such a situation, the sliding window may be set to 32 kB, the last 16 kB of which (i.e. the oldest part) being regularly updated with 16 kB subparts from the secondary dictionary. No loss of compression will result from the removal of the last 16 kB of the initial compression dictionary, while the addition of 16 kB from the secondary dictionary may still improve the compression results.

Figure 8:
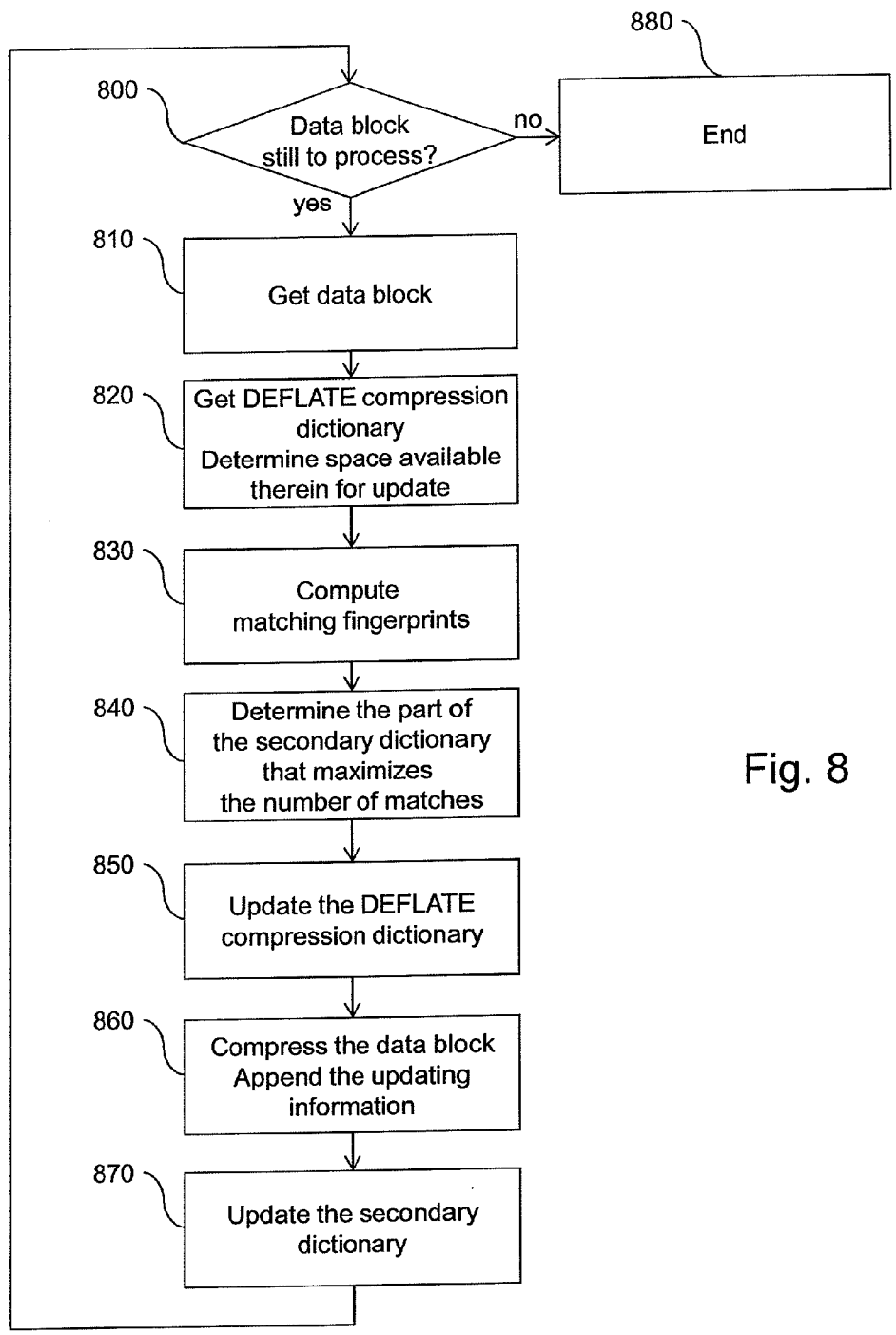
FIG. 8 is a flowchart illustrating steps of a DEFLATE compression method embodying teachings of the invention.

FIG. 8 illustrates the compression method of the invention in the case of the DEFLATE algorithm, where only one subpart is selected from the secondary dictionary for the update of the conventional DEFLATE compression dictionary.

This algorithm iterates through the data blocks at step 800 until there is no more data block (end of the process at step 880).

For each data block successively considered, the process goes through steps 810 to 870.

At step 810, the considered data block is obtained.

At step 820, the conventional DEFLATE compression dictionary is retrieved for the current data block. This DEFLATE compression dictionary generally consists in the last N bytes of compressed data, N being the size of the sliding window.

Still at step 820, the maximum possible update length in the DEFLATE compression dictionary is computed. This is the space available for insertion of data from the secondary dictionary.

The maximum possible update length can be automatically set to the first 75% of the DEFLATE compression dictionary (the oldest encoded data) or the parameter can be computed on the fly based on which parts of the DEFLATE compression dictionary were used as references during compression of the last data block: If long references on the DEFLATE compression dictionary are used, the update size may be reduced since old data of the DEFLATE compression dictionary may still be relevant. On the contrary, if only the latest part of the DEFLATE compression dictionary is used, the update size may be increased.

Fingerprints are then computed at step 830 for several subparts of the current data block and compared to the bank of fingerprints corresponding to the secondary dictionary. A list of matched fingerprints is thus obtained.

The next step is to compute the updating information at step 840, i.e. to select which subpart of the list must be kept for the update.

The size of the (expanded) subpart to use for the update is set to the maximum possible update length as determined at step 820. This means that such a finally kept subpart may cover several matches at once.

At step 840, the maximum-length subpart of the secondary dictionary that covers the maximum number of matches of the list is selected.

The identification of the selected subpart forms the updating information.

Based on the updating information, the DEFLATE compression dictionary is updated at step 850, mainly by substituting the oldest maximum-length data with the selected subpart.

Further to step 850, the current data block is compressed using the conventional DEFLATE algorithm based on the updated dictionary, at step 860).

The updating information are also encoded and appended to the compressed data block.

When ZLib or similar compression formats are used, the updating information can be encoded as part of a dictionary identifier. Such an identifier can be set to the Adler32 checksum of the dictionary.

The updating information may be encoded in the place holder used for the Adler 32. In that case, the Adler 32 contains the difference (delta) between the position in the secondary dictionary of the subpart inserted for the previous data block and the position in the secondary dictionary of the subpart used for the current data block.

The length of the update is then fixed to the maximum possible update length and does not need to be communicated to the decompressing device.

One may note that this algorithm is almost the same as the conventional DEFLATE algorithm in terms of processing costs. Indeed, the cost for searching in the secondary dictionary is very low since fingerprint computation is limited and fingerprint matching is very quick. The update of the DEFLATE compression dictionary is also very fast since it only consists in copying data from one buffer to another.

Since, in most cases, the DEFLATE dictionary update provides an increase of the compression ratio, the overall efficiency and processing speed of input data should be even faster than conventional DEFLATE.

Figure 9:
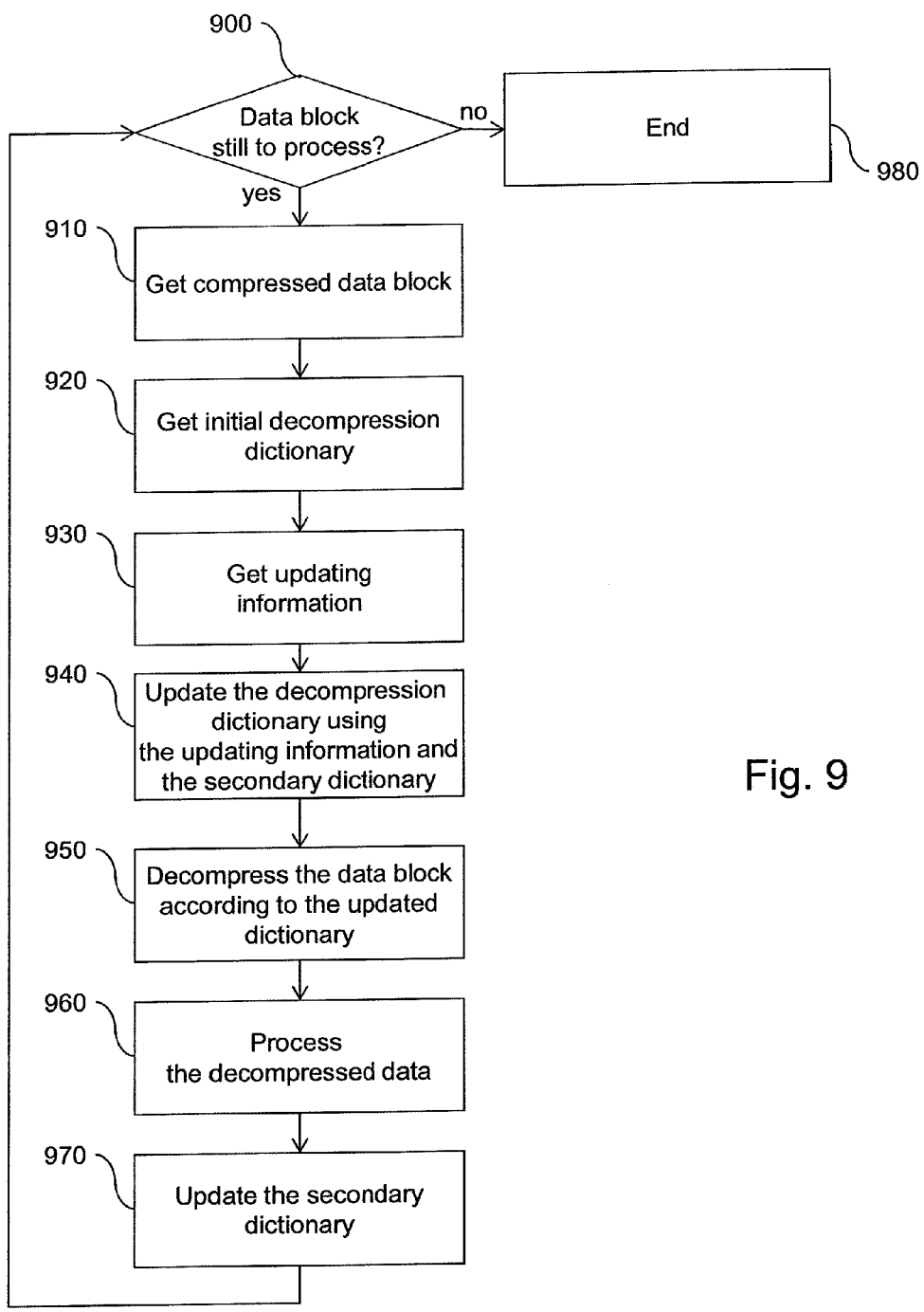
FIG. 9 is a flowchart illustrating general steps of a decompression method of the invention.

Turning now to FIG. 9, the decompressing algorithm, generally implemented by the client receiving the compressed bitstream, is described.

This decompressing algorithm is the reverse of the compressing algorithm as disclosed above. It also processes data block by data block since the received bitstream is structured by compressed data block. The algorithm of the Figure thus processes successively each data block from the corresponding part of the bitstream (test 900) until all data blocks have been decompressed (end of the process at step 980).

For a given data block, the corresponding part of the bitstream (i.e. the compressed data block) is obtained at step 910.

At step 920, the initial decompression dictionary is obtained. It is similar to the initial compression dictionary obtained by the compressing device at step 620.

At step 930, the updating information is obtained from the bitstream. In particular, it is decoded therefrom, to obtain for example: the number of subparts inserted in the initial compression dictionary and, for each inserted subpart, the length of the subpart, the position of the subpart in the secondary dictionary and the location of insertion in the initial compression dictionary.

In the particular case of DEFLATE for which the number of inserted subparts is set to one, with a subpart size fixed to a given value (for instance 75% of the sliding window size), only the position in the secondary dictionary is decoded, for example retrieved from the Adler information.

Once the updating information is known, the initial decompression dictionary is updated at step 940 based on this information. This step includes obtaining a secondary dictionary separate from the initial decompression dictionary; determining at least one subpart of the secondary dictionary based on the obtained updating information; and updating the initial decompression dictionary by inserting the determined at least one subpart therein, to obtain the decompression dictionary used for decompressing the block of data.

Then at step 950, the bitstream corresponding to the current data block is decompressed using that updated decompression dictionary.

The decompressed data block can then be used and processed by the device at step 960.

The secondary dictionary may optionally be updated at step 970 as performed at step 670 for the compressing device. For example, the update of the secondary dictionary may be based on the decompressed data block and/or on new data exchanged with the compressing device.

In this way of decompressing the bitstream, the decompressing device retrieves the data as originally processed by the compressing device.

Although the present invention has been described hereinabove with reference to specific embodiments, the present invention is not limited to the specific embodiments, and modifications which lie within the scope of the present invention will be apparent to a person skilled in the art. Many further modifications and variations will suggest themselves to those versed in the art upon making reference to the foregoing illustrative embodiments, which are given by way of example only and which are not intended to limit the scope of the invention as determined by the appended claims. In particular different features from different embodiments may be interchanged, where appropriate.

The invention claimed is:

1. A method of compressing data, comprising compressing a block of data using one or more references to entries of a compression dictionary, the method further comprising:
   obtaining an initial compression dictionary and a separate secondary dictionary;
   determining at least one subpart of the secondary dictionary that correlates with the block of data to compress;
   updating the initial compression dictionary by inserting the determined at least one subpart therein, to obtain the compression dictionary used for compressing the block of data.

2. The method of claim 1, wherein the initial compression dictionary comprises blocks of data that have already been compressed.

3. The method of claim 2, implemented in a compressing device having a communication session with a remote communicating device, and wherein the secondary dictionary comprises data already exchanged between the compressing device and the remote communicating device.

4. The method of claim 1, wherein determining at least one subpart that correlates the block of data to compress comprises computing fingerprints of several subparts of the block of data to compress as hash values of said subparts and comparing the computed fingerprints with a bank of fingerprints corresponding to subparts of the secondary dictionary.

5. The method of claim 4, wherein determining at least one subpart that correlates with the block of data to compress comprises obtaining a list of subparts of the secondary dictionary, the corresponding fingerprints of which matching with fingerprints for the block of data to compress, and selecting at least one subpart from the list as subpart or subparts to insert into the initial compression dictionary.

6. The method of claim 4, wherein determining at least one subpart that correlates with the block of data to compress comprises obtaining a list of subparts of the secondary dictionary, the corresponding fingerprints of which matching with fingerprints for the block of data to compress; comprises selecting at least one subpart from the list; and comprises expanding a selected subpart with data surrounding it within the secondary dictionary to obtain an expanded subpart to insert into the initial compression dictionary.

7. The method of claim 6, wherein expanding a selected subpart comprises computing surrounding fingerprints for one or more parts of surrounding data of the selected subpart as hash values of said one or more parts, and selecting parts of surrounding data to expand the selected subpart depending on the surrounding fingerprints and fingerprints for the corresponding parts in the block of data to compress.

8. The method of claim 6, wherein expanding a selected subpart comprises merging two subparts of the list that are successive in the secondary dictionary.

9. The method of claim 5 or 6, wherein determining at least one subpart that correlates with the block of data to compress comprises computing, for the or each determined subpart of the list, a location in the initial compression dictionary where to insert the determined subpart; and selecting at least one subpart from the list depends on the computed inserting location of each subpart of the list.

10. The method of claim 5 or 6, wherein selecting at least one subpart from the list comprises selecting a part of the secondary dictionary that includes the maximum number of subparts from the list.

11. The method of claim 4, wherein the bank of fingerprints used for the comparison when compressing a block of data is restricted to fingerprints corresponding to one or more subparts that occur after the last subpart in the secondary dictionary that is used for updating an initial compression dictionary when compressing a previous block of data.

12. The method of claim 4, wherein the subparts of the block of data to compress used for computing fingerprints are defined based on specific items within the block of data.

13. The method of claim 1, wherein the initial compression dictionary changes from the compression of one block of data to the compression of a next block of data, by adding the one block of data to the initial compression dictionary before compressing the next block of data; and the method further comprises determining the position of the oldest data in the initial compression dictionary as the location where the determined at least one subpart is inserted for the updating.

14. The method of claim 1, further comprising sending the compressed block of data together with updating information representing the updating of the initial compression dictionary used for compressing the block of data.

15. The method of claim 14, wherein the updating information comprises the number of determined subparts inserted in the initial compression dictionary and, for each inserted subpart, the length of the subpart, the position of the subpart in the secondary dictionary and a location for insertion in the initial compression dictionary.

16. The method of claim 14, wherein, the updating information only comprises the position of a single subpart in the secondary dictionary.

17. The method of claim 1, wherein determining at least one subpart that correlates with the block of data to compress comprises determining a subpart that correlates with a block of data just compressed and selecting, for the next block of data to compress, the subpart following said determined subpart in the secondary dictionary, as a subpart to insert in the initial compression dictionary.

18. A method of encoding a block of structured data of a structured document, comprising obtaining a structure channel grouping structural information of the structured data and at least one value channel grouping content information that corresponds to the same structural information; and compressing at least one of the structure and value channels using the method of claim 1.

19. The encoding method of claim 18, wherein an initial compression dictionary to compress the structure channel is updated based on the structure channel of another block of structured data previously arranged into structure and value channels.

20. The encoding method of claim 18, wherein an initial compression dictionary to compress the value channel is updated based on a corresponding value channel of another block of structured data previously arranged into structure and value channels, said corresponding value channel of the other block of structured data corresponding to the same structural information as the value channel to compress.

21. A method of decompressing a bitstream, comprising decompressing a block of data of the bitstream using one or more references to entries of a decompression dictionary, the method further comprising:
obtaining an initial decompression dictionary and a separate secondary dictionary;
obtaining, from the bitstream, updating information;
determining at least one subpart of the secondary dictionary based on the obtained updating information;
updating the initial decompression dictionary by inserting the determined at least one subpart therein, to obtain the decompression dictionary used for decompressing the block of data.

22. A compressing unit for compressing data, comprising a compression dictionary and a data compressor for compressing a block of data using one or more references to entries of the compression dictionary, the compressing unit further comprising:
an initial compression dictionary and a separate secondary dictionary;
a correlating data retrieving module for determining at least one subpart of the secondary dictionary that correlates with the block of data to compress;
a compression dictionary updating module for updating the initial compression dictionary by inserting the determined at least one subpart therein, to obtain the compression dictionary used for compressing the block of data.

23. An encoding unit for encoding a block of structured data of a structured document, comprising a channel obtaining unit for obtaining a structure channel grouping structural information of the structured data and at least one value channel grouping content information that corresponds to the same structural information; and a compressing unit according to claim 22 for compressing at least one of the structure and value channels.

24. A decompressing unit for decompressing a bitstream, comprising a decompression dictionary and a data decompressor for decompressing a block of data of the bitstream using one or more references to entries of the decompression dictionary, the decompressing unit further comprising:
an initial decompression dictionary and a separate secondary dictionary;
an updating information module for obtaining, from the bitstream, updating information;
a correlating data retrieving module for determining at least one subpart of the secondary dictionary based on the obtained updating information;
a decompression dictionary updating module for updating the initial decompression dictionary by inserting the determined at least one subpart therein, to obtain the decompression dictionary used for decompressing the block of data.

25. A non-transitory computer-readable medium storing a program which, when executed by a microprocessor or computer system in an apparatus, causes the apparatus to perform the steps of:
obtaining an initial compression dictionary and a separate secondary dictionary;
determining at least one subpart of the secondary dictionary that correlates with the block of data to compress;

updating the initial compression dictionary by inserting the determined at least one subpart therein, to obtain a compression dictionary; and compressing a block of data using one or more references to entries of the compression dictionary.

* * * * *